(12) United States Patent
Tang et al.

(10) Patent No.: US 11,880,110 B2
(45) Date of Patent: Jan. 23, 2024

(54) ARRAY SUBSTRATE AND DISPLAY PANEL

(71) Applicants: Mianyang HKC Optoelectronics Technology Co., Ltd., Sichuan (CN); HKC CORPORATION LIMITED, Shenzhen (CN)

(72) Inventors: Rong Tang, Mianyang (CN); Baohong Kang, Mianyang (CN)

(73) Assignees: Mianyang HKC Optoelectronics Technology Co., Ltd., Mianyang (CN); HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/994,207

(22) Filed: Nov. 25, 2022

(65) Prior Publication Data

US 2023/0168555 A1   Jun. 1, 2023

(30) Foreign Application Priority Data

Nov. 30, 2021 (CN) .......................... 202111445605.8

(51) Int. Cl.
*G02F 1/1362* (2006.01)
*G02F 1/1345* (2006.01)
*H01L 27/12* (2006.01)

(52) U.S. Cl.
CPC ...... *G02F 1/136204* (2013.01); *G02F 1/1345* (2013.01); *G02F 1/136218* (2021.01); *G02F 1/136272* (2021.01); *G02F 1/136222* (2021.01); *G02F 1/136286* (2013.01); *H01L 27/1222* (2013.01)

(58) Field of Classification Search
CPC ............ G02F 1/136204; G02F 1/1345; G02F 1/136272; G02F 1/136218; G02F 2001/1536; G02F 2202/22
See application file for complete search history.

(56) References Cited

U.S. PATENT DOCUMENTS

2006/0066560 A1* 3/2006 Gally .................. G09G 3/3466
345/108

FOREIGN PATENT DOCUMENTS

| CN | 103400546 A | 11/2013 |
|---|---|---|
| CN | 104795040 A | 7/2015 |
| CN | 206370279 U | 8/2017 |
| CN | 108257565 A | 7/2018 |
| CN | 113257206 A | 8/2021 |
| JP | H11142753 A | 5/1999 |

* cited by examiner

*Primary Examiner* — Dung T Nguyen
(74) *Attorney, Agent, or Firm* — Maier & Maier, PLLC

(57) ABSTRACT

Provided are an array substrate and a display panel. The array substrate includes: a base and first leads and second leads disposed in a non-display area on the base, the first leads are electrically connected to pixel electrodes, the second leads are electrically connected to a common electrode or to a ground electrode, the array substrate further includes an electrically actuated component, a bottom surface of which is conductive. After the electrically actuated component changes from an energized state to a de-energized state, the bottom surface is deformed and contacts at least part of the first leads and at least part of the second leads. The pixel electrodes and the common electrode or the ground electrode are shorted as the bottom surface of the electrically actuated component contacts the first leads and the second leads, to release residual charge on the pixel electrode.

20 Claims, 3 Drawing Sheets

ARRAY SUBSTRATE AND DISPLAY PANEL

CROSS-REFERENCE TO RELATED APPLICATIONS

This application claims the benefit of Chinese patent application No. 202111445605.8 filed on Nov. 30, 2021, the contents of which are incorporated herein by reference.

TECHNICAL FIELD

The present application relates to display technologies, and in particular, to an array substrate and a display panel.

BACKGROUND

Generally, the display panel in a liquid crystal display includes an array substrate (thin film transistor array, TFT), a color film substrate (color filter, CF), and a layer of liquid crystal molecules (liquid crystal, LC) sandwiched between the two substrates. In the array substrate, leads are also provided in the non-display area to electrically connect the pixel array to the driver chip.

In the normal operation of the liquid crystal display panel, a certain amount of charge will accumulate on the pixel electrode inside the liquid crystal display panel. When the power is turned off, since the charge on the pixel electrode cannot be eliminated quickly, a certain voltage difference exists between the pixel electrode and the common electrode, which leads to an image retention of the display after shutdown, which will affect the display effect and thus the product quality.

SUMMARY

An embodiment of the present application provides an array substrate and a display panel, in order to reduce the occurrence of image retention in the pixel electrode of the display panel.

The present application proposes the following technical proposals.

In a first aspect, the present application provides an array substrate, including a base and first leads and second leads disposed in a non-display area on the base, the first leads electrically connected to pixel electrodes, the second leads electrically connected to a common electrode or to a ground electrode, the array substrate further including an electrically actuated component, a bottom surface of the electrically actuated component is conductive. The conductive layer of the electrically actuated component is configured to be deformed and contacts at least part of the first leads and at least part of the second leads after the electrically actuated component changes from an energized state to a de-energized state.

In one embodiment, the number of the first leads are multiple, and the first leads and the second leads are arranged in a fan-out configuration; the bottom surface of the electrically actuated component is configured to be in contact with more than half of a total number of the plurality of first leads after being deformed.

In one embodiment, the electrically actuated component includes a first material layer and a second material layer that are laminated, the first material layer is a conductive layer, and is located between the base and the second material layer, and a coefficient of thermal expansion of the second material layer is greater than a coefficient of thermal expansion of the first material layer.

In one embodiment, a ratio of the coefficient of thermal expansion of the second material layer to the coefficient of thermal expansion of the first material layer is 2-60:1.

In one embodiment, the coefficient of thermal expansion of the second material layer is 20-500 ppm/° C., and the coefficient of thermal expansion of the first material layer is 8-20 ppm/° C.;

and/or a thickness of the second material layer is 30-250 μm and/or a thickness of the first material layer is 2-25 μm.

In one embodiment, in one embodiment, a material of the first material layer is at least one selected from the group consisting of a conductive polymer, graphene, a carbon nanotube, metallic iron, and metallic nickel;

and/or the second material layer consists of an insulating material or a conductive material.

In one embodiment, the second material layer consists of the insulating material, the insulating material is at least one selected from the group consisting of silicone, chitosan, cellulose, polytetrafluoroethylene, polyvinylpyrrolidone, and polyvinylidene fluoride;

or the second material layer consists of the conductive material, the conductive material is selected from metallic copper.

In one embodiment, the electrically actuated component is positioned above the first leads and the second leads, and a distance between the conductive layer of the electrically actuated component and the first leads is 1-6 mm, and a distance between the conductive layer of the electrically actuated component and the second leads is 1-6 mm when the conductive layer of the electrically actuated component is in a flat state.

The array substrate provided in this application includes an electrically actuated component which has an electro-actuated deformation effect that can cause the conductive layer of the electrically actuated component to deform into contact with at least a part of the first leads and at least a part of the second leads when the electrically actuated component changes from an energized state to a de-energized state. Since the first leads are connected to the pixel electrodes on the array substrate and the second leads are connected to the common electrode or the ground electrode on the array substrate, the pixel electrode and the common electrode or the ground electrode are shorted as the conductive layer of the electrically actuated component contacts the first leads and the second leads, so that the residual charge left in the pixel electrode due to shutdown can be released quickly. Therefore, the image retention phenomena of the display panel can be improved, and the display effect can be enhanced.

In a second aspect, the present application further provides a display panel, including: the array substrate of the present application, a color film substrate arranged to face the array substrate, and a liquid crystal layer disposed between the array substrate and the color film substrate.

In one embodiment, a driver chip is also electrically connected to the first leads and the second leads.

The display panel provided by the present application includes an array substrate including an electrically actuated component which has an electro-actuated deformation effect. The pixel electrode and the common electrode or the ground electrode are shorted when the electrically actuated component changes from an energized state to a de-energized state, so that the residual charge left on the pixel electrode due to shutdown can be released quickly. Therefore, the image retention phenomena of the display panel can be improved, and the display effect can be enhanced.

BRIEF DESCRIPTION OF THE DRAWINGS

In order to more clearly illustrate the technical proposals in embodiments of the present application, accompanying drawings that are used in the description of the embodiments or exemplary technologies are briefly introduced hereinbelow. Obviously, the drawings in the following description are merely some embodiments of the present application. For those skilled in the art, other drawings can also be obtained according to these drawings without any creative effort.

DETAILED DESCRIPTION OF THE EMBODIMENTS

Figure 1:
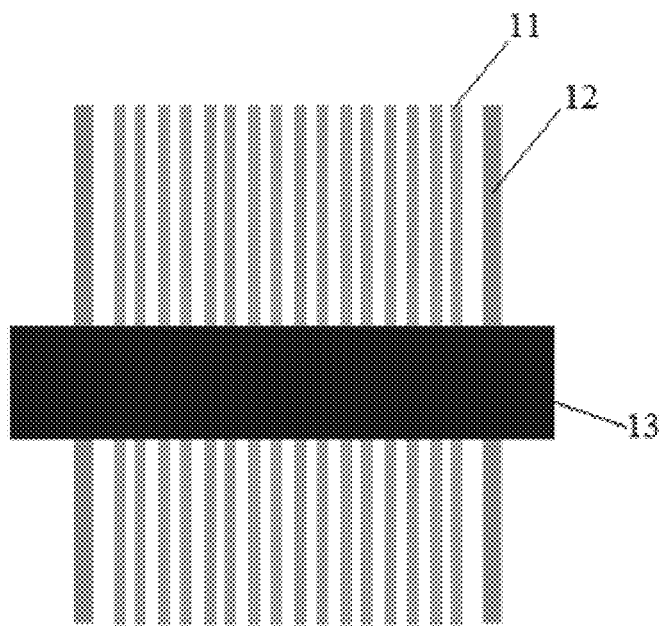
FIG. 1 is a top view of the location of the electrically actuated component in the array substrate provided in a first embodiment of the present application.

In order to make the purpose, technical proposals, and advantages of the present application more clearly understood, the present application will be described in further detail hereinbelow with reference to the accompanying drawings and embodiments. It should be understood that the specific embodiments described herein are merely used to explain the present application, but not to limit the present application.

It should be noted that when an element is referred to as being "provided" or "set" on another element, it can be directly on the other element or indirectly on the other element. When an element is referred to as being "connected to" another element, it can be directly connected to the other element or indirectly connected to the other element.

It is to be understood that the terms "upper", "lower", etc. for indicating orientations or positional relationships refer to orientations or positional relationships as shown in the accompanying drawings; the terms are for the purpose of illustrating the present application and simplifying the description rather than indicating or implying the device or element must have a certain orientation and be structured or operated by the certain orientation, and therefore cannot be regarded as limitation to the present application.

In the present application, the term "and/or", which describes the relationship between related objects, means that there can be three relationships, for example, A and/or B, which can represent circumstances that A exists alone, A and B exist at the same time, and B exists alone, where A and B can be singular or plural. The character "/" generally indicates that the associated objects are an "or" relationship.

In the present application, "at least one" means one or more, and "a plurality of" means two or more. "At least one item below" or similar expressions refer to any combination of these items, including any combination of single item or plural items.

It should be understood that in the various embodiments of the present application, the order of the serial numbers of the above processes does not imply the order of execution, and some or all of the steps may be executed in parallel or in sequence, and the order of execution of the processes shall be determined by their function and inherent logic, and shall not constitute any limitation to the processes implemented in the embodiments of the present application.

The terms used in the embodiments of the present application are merely for the purpose of describing detailed embodiments, and are not intended to limit the present application. As used in the embodiments of this application and the appended claims, the singular forms "a," "said", and "the" are intended to include their plural forms as well, unless the context clearly dictates otherwise.

The terms "first" and "second" are merely used for descriptive purposes to distinguish objects such as substances from each other, and cannot be understood as indicating or implying relative importance or implying the number of indicated technical features. For example, without departing from the scope of the embodiments of the present application, "the first" may also be referred to as "the second", and similarly, "the second" may also be referred to as "the first". Thus, a feature defined as "first" or "second" may expressly or implicitly include one or more of the features.

First Embodiment

Figure 2:
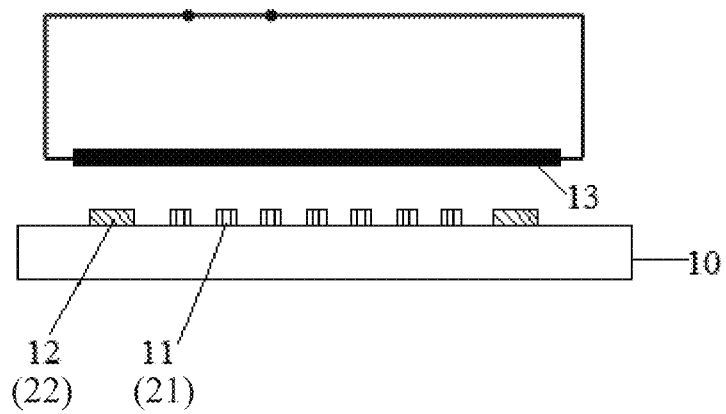
FIG. 2 is a schematic cross-sectional view of the electrically actuated component in an energized state in the array substrate provided in the first embodiment of the present application.
Figure 3:
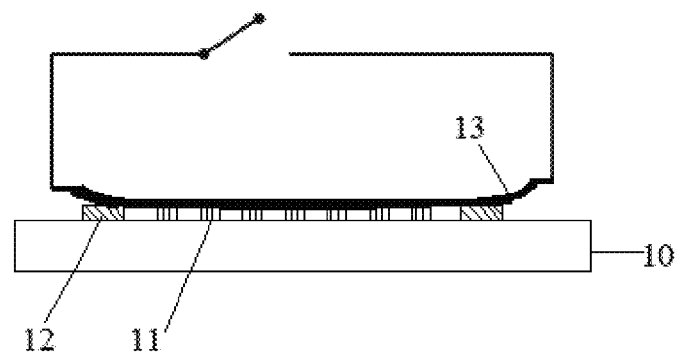
FIG. 3 is a schematic cross-sectional view of the electrically actuated component in a de-energized state in the array substrate provided in the first embodiment of the present application.

An array substrate, as shown in FIGS. 1-3, includes a base 10 and first leads 11 and second leads 12 disposed in a non-display area on the base 10, the first leads 11 are electrically connected to pixel electrodes, and the second leads 12 are electrically connected to a common electrode or to a ground electrode. The array substrate further includes an electrically actuated component 13, a bottom surface of which is conductive. After the electrically actuated component 13 changes from an energized state to a de-energized state, the conductive bottom surface of the electrically actuated component 13 is deformed and contacts at least part of the first leads 11 and at least part of the second leads 12.

The array substrate of this embodiment includes the electrically actuated component 13, which has an electro-actuated deformation effect, and the bottom surface of the electrically actuated component 13 is deformed when the electrically actuated component 13 changes from the energized state to the de-energized state. Therefore, the electrically actuated component 13 may be prepared in advance into a bent state, that is, the bottom surface of the electrically actuated component 13 is bent when being in the non-energized state (namely, when turned off), and the bottom surface of the electrically actuated component 13 is deformed to a flat shape when being in the energized state, such that, the bottom surface of the electrically actuated component 13 returns to a bent state to contact the first leads 11 and the second leads 12 when the power is turned off. The electrically actuated component 13 may include one or more conductive layers. After the electrically actuated component 13 changes from the energized state to the de-energized state, the pixel electrodes and the common electrode or the ground electrode are shorted as long as one of the conductive layers of the electrically actuated component 13 is in contact with the first leads 11 and the second leads 12.

Specifically, the electrically actuated component 13 can be positioned above the first leads 11 and the second leads 12 which are in the non-display area of the array substrate, and the conductive layer is arranged on a lower surface of the electrically actuated component 13. Under normal operation of the display panel as shown in FIG. 2, the electrically actuated component 13 is energized so that the lower surface of the electrically actuated component 13 remains flat and does not contact the first leads 11 and the second leads 12. As shown in FIG. 3, when the power is turned off, the electrical energy applied on the electrically actuated component 13 is withdrawn, and the electrically actuated component 13 is deformed due to being de-energized. The lower surface of the electrically actuated component 13 which is conductive changes from a flat state to a bent state, thus contacts the first leads 11 (connected to the pixel electrodes of the display panel) and the second leads 12 (connected to the common electrode or the ground electrode of the display panel), so that the pixel electrode and the common electrode or the ground electrode are shorted. Therefore, the array substrate allows the residual charge left on the pixel electrode of the display panel due to shutdown to be released quickly, thereby improving the image retention phenomena of the display panel and enhancing the display effect.

Specifically, the number of the first leads 11 are multiple, and the first leads 11 and the second leads 12 are arranged in a fan-out configuration. The conductive layer on the lower surface of the electrically actuated component 13 is in contact with more than half of the total number of the first leads 11 after the conductive layer is deformed, and the fan-out wiring configuration allows the leads on the array substrate to better match the contacts of the driver chip. Each of the plurality of first leads 11 is connected to an array of the pixel electrodes on the array substrate, while the second leads 12 are connected to the common electrode or to the ground electrode, and the number of the second leads 12 may also be multiple.

It should be understood that, when the conductive layer of the electrically actuated component 13 deforms to contact at least part of the first leads 11 and at least part of the second leads 12, the conductive layer of the electrically actuated component 13 may contact a part of one or more first leads 11 and simultaneously contact a part of one or more second leads 12, after changing from a flat state to a bent state, so as to energize the first leads 11 and the second leads 12 to short the pixel electrode and the common electrode or the ground electrode. When the second lead 12 is electrically connected to the common electrode, the conductive layer of the electrically actuated component 13 may only contact one second lead 12 because the common electrodes are connected to each other. While the pixel electrode arrays are independent of each other, and each of the first leads 11 is connected to a separate pixel electrode array, therefore, when the conductive layer of the electrically actuated component 13 changes from a flat state to a bent state to contact one of the first leads 11, the residual charge left in the pixel electrode connected to that first lead 11 due to shutdown can be quickly released, and when the conductive layer is in contact with a plurality of first leads 11, the residual charge left in the pixel electrodes connected to the plurality of first leads 11 due to shutdown can be quickly released. Of course, for a better improvement to the image retention phenomena of the display panel after shutdown, the conductive layer of the electrically actuated component 13 may be in contact with more than half of the total number of the first leads 11, for example, with more than 60% of the total number of the first leads 11, or, of course, with each of the first leads 11 on the array substrate.

Specifically, the plurality of first leads 11 may be signal wires connecting the data lines in the display panel, and the data lines are connected to the pixel electrodes through the TFT switch. After receiving a shutdown signal, the gates of the TFT switch are all switched on, at the same time, the conductive layer of the electrically actuated component 13 contacts the first leads 11 and the second leads 12 due to deformation after de-energization, thus resulting in a short-circuit between the first leads 11 and the second leads 12 (which may be common electrode wires connected to the common electrodes in the panel), thereby accelerating the release of the residual charge in the pixel electrodes.

Specifically, when the conductive layer of the electrically actuated component 13 is in the planar state, the distance between the conductive layer of the electrically actuated component 13 and the first leads 11 is 1-6 mm, and the distance between the conductive layer of the electrically actuated component 13 and the second leads 12 is 1-6 mm. The electrically actuated component 13 may be positioned above the first leads 11 and the second leads 12 which are in the non-display area of the array substrate, and the conductive layer is arranged on the lower surface of the electrically actuated component 13. As such, the distance between the lower surface of the electrically actuated component 13 and the first leads 11 is 1-6 mm, and the distance between the lower surface of the electrically actuated component 13 and the second leads 12 is 1-6 mm when the lower surface of the electrically actuated component 13 is in the planar state. Within this distance, the electrically actuated component 13 may be well in contact with the first leads 11 and the seconds 12 when the electrically actuated component 13 is energized into a bent state.

Second Embodiment

Figure 4:
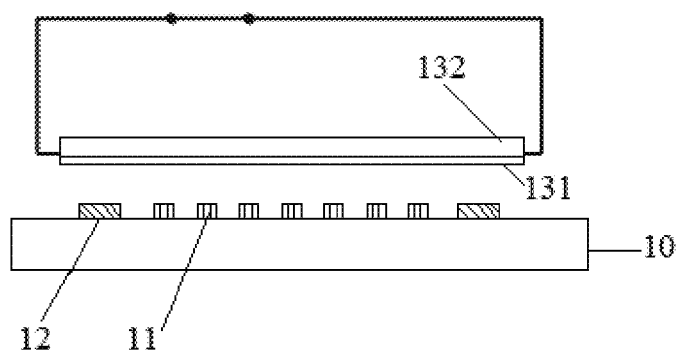
FIG. 4 is a schematic cross-sectional view of the electrically actuated component in an energized state in the array substrate provided in a second embodiment of the present application.
Figure 5:
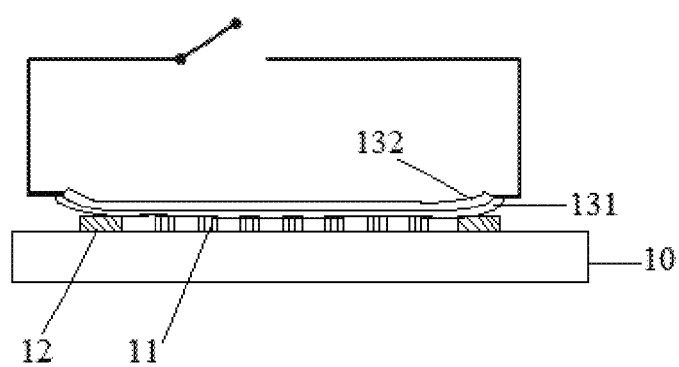
FIG. 5 is a schematic cross-sectional view of the electrically actuated component in a de-energized state in the array substrate provided in the second embodiment of the present application.

An array substrate, as shown in FIGS. 1 and 4 to 5, includes a base 10 and first leads 11 and second leads 12 disposed in a non-display area on the base 10, the first leads 11 are electrically connected to pixel electrodes, and the second leads 12 are electrically connected to a common electrode or to a ground electrode. The array substrate further includes an electrically actuated component 13, and the electrically actuated component 13 includes a first material layer 131 and a second material layer 132 that are laminated, the first material layer 131 is a conductive layer located between the base 10 and the second material layer 132, and a coefficient of thermal expansion of the second material layer 132 is greater than a coefficient of thermal expansion of the first material layer 131. After the electrically actuated component 13 changes from an energized state to a de-energized state, a lower surface of the electrically actuated component 13 is deformed to contact at least part of the first leads 11 and at least part of the second leads 12.

In the array substrate of the present embodiment, the electrically actuated component 13 located above the first leads 11 and the second leads 12 has a double-layer structure, namely, a first material layer 131 and a second material layer 132 that are laminated, and the electrically actuated component 13 demonstrates an electro-actuated effect. Specifically, the coefficients of thermal expansion of the first and second material layers 131 and 132 are different, and the double-layer structure is able to deform under electrically induced heat. The electrically actuated component 13 is prepared in advance into a bent state, and when the electrical energy is converted to thermal energy in the energized state, the double-layer structure is deformed to a flat state. Under normal operation of the display panel as shown in FIG. 4, the electrically actuated component 13 is energized, and the first material layer 131 and the second material layer 132 of the electrically actuated component 13 remain flat and do not contact the first leads 11 and the second leads 12. When the power is turned off as shown in FIG. 5, the electrical energy applied on the electrically actuated component 13 is withdrawn, and the electrically actuated component 13 is deformed from the flat state into the bent state, and the conductive first material layer 131 is bent to contact the first leads 11 and the second leads 12, thus causing the pixel electrode and the common electrode or the ground electrode to be shorted.

The laminated first and second material layers 131 and 132 form a double-layer structure, which has good electro-actuated effect that deforms under electrically induced heat due to the different coefficients of thermal expansion. Specifically, the electrically actuated component 13 consists of the first material layer 131 and the second material layer 132, with the first material layer 131 as the lower surface of the electrically actuated component 13, such that the first material layer 131 is able to contact the first leads 11 and the second leads 12 when changing from the flat state to the bent state.

Specifically, the ratio of the coefficient of thermal expansion of the second material layer 132 to the coefficient of thermal expansion of the first material layer 131 in the electrically actuated component 13 is 2-60:1, for example, it may be 2:1, 5:1, 10:1, 15:1, 25:1, 40:1, 45:1, 50:1, 60:1, and so on. As the ratio of the coefficient of thermal expansion of the second material layer 132 to the coefficient of thermal expansion of the first material layer 131 becomes larger, the electrically actuated component 13 is bent more easily, which is able to well contact the first leads 11 and the second leads 12. The coefficient of thermal expansion of the second material layer 132 may be 20-500 ppm/° C., for example, may be 20-50 ppm/° C., 50-100 ppm/° C., 100-250 ppm/° C., 300-500 ppm/° C., and so on. The coefficient of thermal expansion of the first material layer 131 may be 8-20 ppm/° C., for example, may be 8-10 ppm/° C., 10-12 ppm/° C., 12-15 ppm/° C., 15-20 ppm/° C., and so on.

Specifically, the thickness of the second material layer 132 in the electrically actuated component 13 is 30-250 μm, for example, may be 30-50 μm, 50-100 μm, 100-150 μm, 200-250 μm, and so on. The thickness of the first material layer 131 is 2-25 μm, for example, may be 2-5 μm, 5-10 μm, 20-25 μm, and so on. The electrically actuated component 13 formed with a thickness within the above thickness range can bend well due to the electro-actuated deformation effect.

Specifically, the first material layer 131 is a conductive layer, and a material thereof is selected from at least one of a conductive polymer, graphene, a carbon nanotube, metallic iron, and metallic nickel. The first material layer 131 made of the above conductive materials shows good electrical conductivity, and is able to bend to contact the first leads 11 and the second leads 12, thus causing a short-circuit.

Specifically, the second material layer 132 consists of an insulating material or a conductive material. For example, when the second material layer 132 consists of an insulating material, the insulating material is selected from at least one of silicone, chitosan, cellulose, polytetrafluoroethylene, polyvinylpyrrolidone and polyvinylidene fluoride. These materials show excellent electro-actuated deformation effect, allowing the second material layer 132 to deform to bend easily. Or the second material layer 132 consists of a conductive material, and the conductive material is metallic copper. The first material layer 131 and the second material layer 132 are both conductive, so that a good electrical conduction can be achieved when the electrically actuated component 13 is in contact with the first leads 11 and the second leads 12.

The array substrate of this embodiment may also include an encapsulation housing for encapsulating the electrically actuated component 13. This can provide good protection to enhance the stability of the electrically actuated component 13. In addition, the base 10 in the array substrate may be a glass substrate.

Third Embodiment

Figure 6:
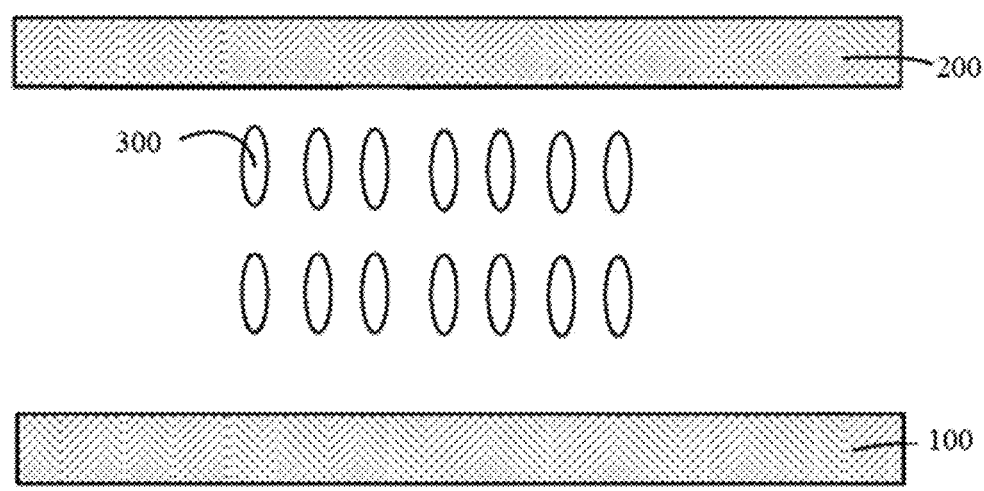
FIG. 6 is a schematic diagram of the display panel provided in a third embodiment of the present application.

As shown in FIG. 6, a display panel includes the array substrate 100 in the embodiments of the present application, a color film substrate 200 arranged to face the array substrate 100, and a liquid crystal layer 300 disposed between the array substrate 100 and the color film substrate 200. Specifically, the array substrate includes a base 10 and first leads 11 and second leads 12 disposed in a non-display area on the base 10, the first lead 11s are electrically connected to pixel electrodes, and the second leads 12 are electrically connected to a common electrode or to a ground electrode. The array substrate further includes an electrically actuated component 13, which has at least one conductive layer. After the electrically actuated component 13 changes from an energized state to a de-energized state, the conductive layer of the electrically actuated component 13 is deformed and contacts at least part of the first leads 11 and at least part of the second leads 12.

The display panel includes the array substrate in the embodiments of the present application, the array substrate includes an electrically actuated component 13 which has an electro-actuated deformation effect. When the electrically actuated component 13 changes from an energized state to a de-energized state, the pixel electrode and the common electrode (or the ground electrode) are shorted, as a result of the conductive layer deformed from the flat state to the bent state to contact the first leads 11 and the second leads 12, so that the residual charge left on the pixel electrode due to shutdown can be released quickly. Therefore, the image retention phenomena of the display panel can be improved, and the display effect can be enhanced.

Specifically, under normal operation of the display panel as shown in FIG. 2, the electrically actuated component 13 is energized so that the electrically actuated component 13 remains flat and does not contact the first leads 11 and the second leads 12. As shown in FIG. 3, when the power is turned off, the electrically actuated component 13 is de-energized and bends. The conductive layer on the lower surface of the electrically actuated component 13 contact the first leads 11 and the second leads 12 to conduct electricity. Since the first electrode 21 (pixel electrode) is connected to the first leads 11 and the second electrode 22 (common or ground electrode) is connected to the second leads 12, so that the first electrode 21 and the second electrode 22 can be shorted. Therefore, the image retention phenomena of the display panel can be improved, and the display effect can be enhanced.

Specifically, the display panel is a liquid crystal display panel. The display panel includes a driver chip electrically connected to the first leads 11 and the second leads 12 of the array substrate. The driver chip is located in the non-display area; the driver chip may provide drive signals to the pixel electrode array through the first leads 11 to control the pixel array to display the image.

It should be noted that the display panel provided in this embodiment can be provided with the array substrate in the above-mentioned first embodiment and second embodiment, therefore, the above-mentioned proposals of the array substrate can be used in the display panel, and the display panel has all the advantages of the array substrate provided in the above embodiments, and will not be repeated here.

In addition, the control circuit of the electrically actuated component 13 may be integrated into the power IC (power integrated circuit), as the power IC may control the display panel as a whole to switch on and off. The control circuit is open and the electrically actuated component 13 is de-energized when the power IC is powered, and the control circuit is closed and the electrically actuated component 13 is energized when the power IC is powered. The assembly of printed circuit boards can meet a variety of wiring needs, so the wirings of the control circuit and other circuits of the display panel can be independent. The encapsulation method of the display panel may be chip on film (COF), that is, the integrated circuit (IC) is fixed on the flexible circuit board; or chip on board (COB), that is, through the bonding of the IC die fixed on the printed circuit board; or chip on glass (COG), that is, the chip fixed on the glass.

The above are merely optional embodiments of the present application, and are not intended to limit the present application. Any modification, equivalent replacement, and improvement made within the spirit and principle of the present application shall fall within the scope of protection of the present application.

What is claimed is:

1. An array substrate, comprising:
    a base; and
    first leads and second leads, which are disposed in a non-display area on the base, the first leads electrically connected to pixel electrodes, and the second leads electrically connected to a common electrode or to a ground electrode;
    wherein the array substrate further comprises an electrically actuated component, a bottom surface of the electrically actuated component is conductive, and
    the bottom surface of the electrically actuated component is configured to be deformed to contact at least part of the first leads and at least part of the second leads, after the electrically actuated component changes from an energized state to a de-energized state.

2. The array substrate according to claim 1, wherein the first leads comprise a plurality of first leads, and the plurality of first leads and the second leads are configured in a fan-out configuration, and
    the bottom surface of the electrically actuated component is configured to be in contact with more than half of a total number of the plurality of first leads after the bottom surface is deformed.

3. The array substrate according to claim 2, wherein the electrically actuated component is positioned above the first leads and the second leads; and
    a distance between the bottom surface of the electrically actuated component and the first leads is 1-6 mm when the bottom surface of the electrically actuated component is in a flat state; and
    a distance between the bottom surface of the electrically actuated component and the second leads is 1-6 mm when the bottom surface of the electrically actuated component is in a flat state.

4. The array substrate according to claim 1, wherein the electrically actuated component comprises a first material layer and a second material layer that are laminated, the first material layer is a conductive layer, and is located between the base and the second material layer; and
    a coefficient of thermal expansion of the second material layer is greater than a coefficient of thermal expansion of the first material layer.

5. The array substrate according to claim 4, wherein a ratio of the coefficient of thermal expansion of the second material layer to the coefficient of thermal expansion of the first material layer is 2-60:1.

6. The array substrate according to claim 5, wherein the coefficient of thermal expansion of the second material layer is 20-500 ppm/° C., and the coefficient of thermal expansion of the first material layer is 8-20 ppm/° C.; and/or
    a thickness of the second material layer is 30-250 μm and a thickness of the first material layer is 2-25 μm.

7. The array substrate according to claim 6, wherein the electrically actuated component is positioned above the first leads and the second leads; and
    a distance between the conductive layer of the electrically actuated component and the first leads is 1-6 mm when the conductive layer of the electrically actuated component is in a flat state; and
    a distance between the conductive layer of the electrically actuated component and the second leads is 1-6 mm when the conductive layer of the electrically actuated component is in a flat state.

8. The array substrate according to claim 5, wherein the electrically actuated component is positioned above the first leads and the second leads; and
    a distance between the conductive layer of the electrically actuated component and the first leads is 1-6 mm when the conductive layer of the electrically actuated component is in a flat state; and
    a distance between the conductive layer of the electrically actuated component and the second leads is 1-6 mm when the conductive layer of the electrically actuated component is in a flat state.

9. The array substrate according to claim 4, wherein a material of the first material layer is at least one selected from the group consisting of: a conductive polymer, graphene, a carbon nanotube, metallic iron and metallic nickel; and/or
    the second material layer consists of: an insulating material or a conductive material.

10. The array substrate according to claim 9, wherein the second material layer consists of the insulating material, and the insulating material is at least one selected from the group consisting of silicone, chitosan, cellulose, polytetrafluoroethylene, polyvinylpyrrolidone and polyvinylidene fluoride; or
    the second material layer consists of the conductive material, and the conductive material is selected from metallic copper.

11. The array substrate according to claim 10, wherein the electrically actuated component is positioned above the first leads and the second leads; and
    a distance between the conductive layer of the electrically actuated component and the first leads is 1-6 mm when the conductive layer of the electrically actuated component is in a flat state; and
    a distance between the conductive layer of the electrically actuated component and the second leads is 1-6 mm when the conductive layer of the electrically actuated component is in a flat state.

12. The array substrate according to claim 9, wherein the electrically actuated component is positioned above the first leads and the second leads; and
- a distance between the conductive layer of the electrically actuated component and the first leads is 1-6 mm when the conductive layer of the electrically actuated component is in a flat state; and
- a distance between the conductive layer of the electrically actuated component and the second leads is 1-6 mm when the conductive layer of the electrically actuated component is in a flat state.

13. The array substrate according to claim 4, wherein the electrically actuated component is positioned above the first leads and the second leads; and
- a distance between the conductive layer of the electrically actuated component and the first leads is 1-6 mm when the conductive layer of the electrically actuated component is in a flat state; and
- a distance between the conductive layer of the electrically actuated component and the second leads is 1-6 mm when the conductive layer of the electrically actuated component is in a flat state.

14. The array substrate according to claim 1, wherein the electrically actuated component is positioned above the first leads and the second leads; and
- a distance between the bottom surface of the electrically actuated component and the first leads is 1-6 mm when the bottom surface of the electrically actuated component is in a flat state; and
- a distance between the bottom surface of the electrically actuated component and the second leads is 1-6 mm when the bottom surface of the electrically actuated component is in a flat state.

15. A display panel, comprising:
an array substrate;
a color film substrate arranged to face the array substrate; and
a liquid crystal layer disposed between the array substrate and the color film substrate;
wherein the array substrate comprises:
a base; and
first leads and second leads, which are disposed in a non-display area on the base, the first leads electrically connected to pixel electrodes, and the second leads electrically connected to a common electrode or to a ground electrode;
wherein the array substrate further comprises an electrically actuated component, a bottom surface of the electrically actuated component is conductive, and
the bottom surface of the electrically actuated component is configured to be deformed to contact at least part of the first leads and at least part of the second leads after the electrically actuated component changes from an energized state to a de-energized state.

16. The display panel according to claim 15, wherein the first leads comprise a plurality of first leads, and the plurality of first leads and the second leads are configured in a fan-out configuration, and
the bottom surface of the electrically actuated component is configured to be in contact with more than half of a total number of the plurality of first leads after the bottom surface is deformed.

17. The display panel according to claim 15, wherein the electrically actuated component comprises a first material layer and a second material layer that are laminated, the first material layer is a conductive layer, and is located between the base and the second material layer; and
a coefficient of thermal expansion of the second material layer is greater than a coefficient of thermal expansion of the first material layer.

18. The display panel according to claim 17, wherein a ratio of the coefficient of thermal expansion of the second material layer to the coefficient of thermal expansion of the first material layer is 2-60:1.

19. The display panel according to claim 18, wherein the coefficient of thermal expansion of the second material layer is 20-500 ppm/° C., and the coefficient of thermal expansion of the first material layer is 8-20 ppm/° C.; and/or
a thickness of the second material layer is 30-250 μm and a thickness of the first material layer is 2-25 μm.

20. The display panel according to claim 17, wherein a material of the first material layer is at least one selected from the group consisting of: a conductive polymer, graphene, a carbon nanotube, metallic iron and metallic nickel; and/or
the second material layer consists of an insulating material or a conductive material.

* * * * *